United States Patent
Jung et al.

(10) Patent No.: US 12,354,850 B2
(45) Date of Patent: Jul. 8, 2025

(54) APPARATUS AND METHOD FOR PROCESSING SUBSTRATE

(71) Applicant: EUGENE TECHNOLOGY CO., LTD., Yongin-si (KR)

(72) Inventors: Woo Duck Jung, Yongin-si (KR); Jeong Hee Jo, Yongin-si (KR); Ryong Hwang, Yongin-si (KR); Se Jong Sung, Yongin-si (KR); Woong Joo Jang, Yongin-si (KR); Sang Soon Jung, Yongin-si (KR)

(73) Assignee: EUGENE TECHNOLOGY CO., LTD., Yongin-si (KR)

( * ) Notice: Subject to any disclaimer, the term of this patent is extended or adjusted under 35 U.S.C. 154(b) by 96 days.

(21) Appl. No.: 18/160,812

(22) Filed: Jan. 27, 2023

(65) Prior Publication Data
US 2023/0245867 A1    Aug. 3, 2023

(30) Foreign Application Priority Data
Jan. 28, 2022   (KR) .......................... 10-2022-0013374

(51) Int. Cl.
*H01J 37/32*    (2006.01)
(52) U.S. Cl.
CPC ... *H01J 37/32715* (2013.01); *H01J 2237/026* (2013.01)
(58) Field of Classification Search
None
See application file for complete search history.

(56) References Cited

U.S. PATENT DOCUMENTS

2022/0230852 A1\* 7/2022 Kato ................. H01J 37/32715

\* cited by examiner

*Primary Examiner* — Wilson Lee
(74) *Attorney, Agent, or Firm* — Rabin & Berdo, P.C.

(57) ABSTRACT

According to an embodiment of the present invention, an apparatus for processing substrate comprising: a susceptor; and a cover unit installed on an upper part of the susceptor, the substrate is placed on the cover unit, wherein the cover unit comprises: a cover frame having one or more air gaps; and one or more covers having a shape corresponding to each of the air gaps and mountable in each of the air gaps, wherein a depth of the air gap is at least three times the thickness of the substrate.

7 Claims, 5 Drawing Sheets

| Dielectric Material | Comparison | | | Remark |
|---|---|---|---|---|
| | Air gap | Equality & inequality Sign | Quartz | |
| permittivity | 1 | < | 4 | - |
| Vp Plasma potential | constant | = | constant | proportional to input power |
| Vf Floating potential | ε(1)V | < | ε(4)V | Q=CV C ∝ ε(permittivity) |
| sheath potential (Vsh = Vp-Vf) | Vp-ε(1)V | > | Vp-ε(4)V | Ion Energy ∝ Vsh |
| Process THK | ↑ | > | - | - |

APPARATUS AND METHOD FOR PROCESSING SUBSTRATE

BACKGROUND

The present invention relates to an apparatus and a method for processing substrate, and more particularly, to an apparatus and a method for processing substrate using a cover unit installed on an upper portion of a susceptor.

In relation to a uniformity of N % concentration in a plasma nitridation process, a higher level of dispersion improvement technology is required according to device miniaturization. In particular, the technology that can independently control the center/edge based on the N % concentration map has become the most important process control factor.

Conventional equipment of plasma nitridation adjusts the uniformity by manually adjusting the height of the susceptor or the height of the antenna, but even this is difficult to satisfy the level required by modern process miniaturization. In particular, since the above-mentioned method has a problem in that the center region and the edge region are not independently controlled, the uniformity required by the device is not satisfied or the edge region N % concentration degradation is intensified. In order to improve this problem, independent control of N % concentration is attempted by using two or more antennas to distribute the center/edge. However, as the number of antennas increases, not only the RF matching rate due to plasma interference is limited, but also problems such as the need to change of core parts and mechanical design of the device occur.

SUMMARY

The present invention provides an apparatus and a method for processing substrate capable of easily adjusting process uniformity.

Further another object of the present invention will become evident with reference to following detailed descriptions and accompanying drawings.

According to an embodiment of the present invention, an apparatus for processing substrate comprising: a susceptor; and a cover unit installed on an upper part of the susceptor, the substrate is placed on the cover unit, wherein the cover unit comprises: a cover frame having one or more air gaps; and one or more covers having a shape corresponding to each of the air gaps and mountable in each of the air gaps, wherein a depth of the air gap is at least three times the thickness of the substrate.

The air gaps may comprise: a center gap located centrally; a plurality of middle gaps disposed along the circumference of the center gap, the middle gaps have a center angle of 20 degrees or more; and a plurality of edge gaps disposed along the circumference of the middle gaps, the edge gaps have a center angle of 20 degrees or more.

The cover frame may comprise: a disk disposed in parallel with the upper surface of the susceptor; and a plurality of spacers installed on the upper surface of the disk to form the air gaps between the substrate and the disk, the spacers have a thickness three or more times the thickness of the substrate, wherein the spacer comprises: a plurality of circular spacers concentrically disposed with respect to the center of the disk; and a plurality of radial spacers arranged radially with respect to the center of the disk to connect the circular spacers, respectively.

The covers may comprise: a center cover mountable in the center gap; a plurality of middle covers each mountable in the middle gap; and a plurality of edge covers each mountable in the edge gap.

The cover frame and the cover may be different materials.

According to an embodiment of the present invention, a method for processing substrate using a cover unit installed on a susceptor and comprising a cover frame having one or more air gaps and one or more covers mountable in each of the air gaps, the method comprising: performing a process with a first substrate placed on top of the cover unit; measuring a process rate of the first substrate; removing the cover corresponding to a portion of the first substrate having a low process rate, so that the air gap is disposed below the portion of the first substrate having a low process rate; and performing the process with a second substrate placed on top of the cover unit.

According to another embodiment of the present invention, a method for processing a substrate using a cover unit installed on a susceptor and comprising a cover frame having one or more air gaps and one or more covers mountable in each of the air gaps, the method comprising: performing a process with a first substrate placed on top of the cover unit; measuring a process rate of the first substrate; disposing the covers, so that the first cover disposed below a portion of the first substrate with the low process rate has a smaller dielectric constant than the second cover disposed below a portion of the first substrate with the high process rate; and performing the process with a second substrate placed on top of the cover unit.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, exemplary embodiments of the present invention will be described in more detail with reference to FIGS. 1 to 8. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration.

Figure 1:
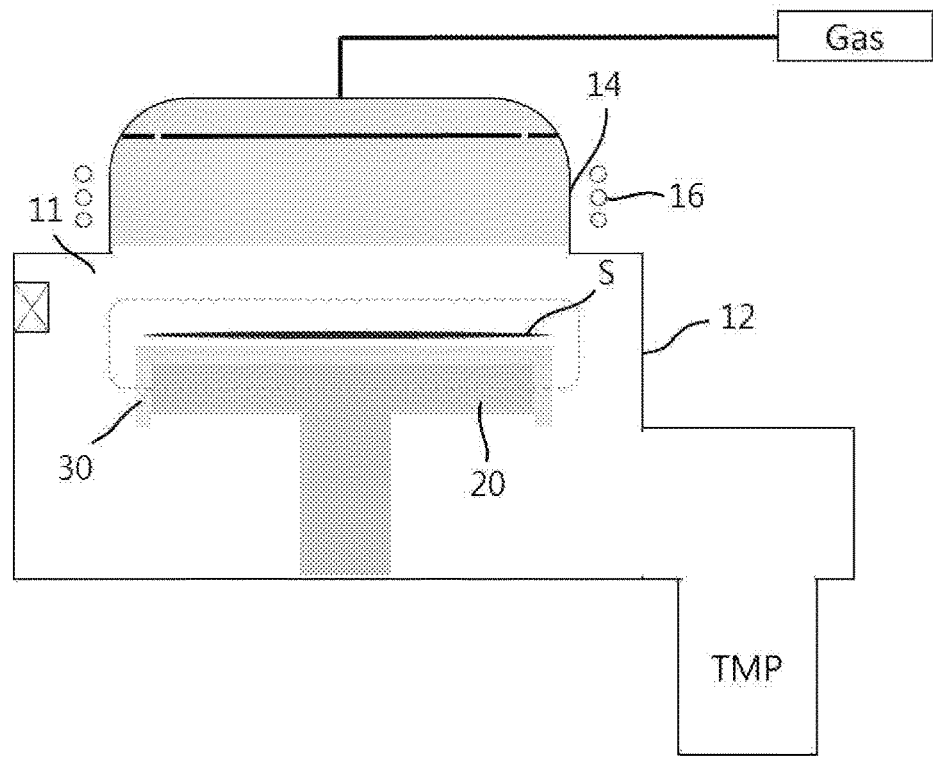
FIG. 1 is a schematic view illustrating an apparatus for processing substrate according to an embodiment of the present invention.

FIG. 1 is a schematic view illustrating an apparatus for processing substrate according to an embodiment of the present invention. As illustrated in FIG. 1, a lower chamber 12 has an inner space 11, and a upper part of the lower chamber 12 is open. The upper chamber 14 is installed on the opened top of the lower chamber 12 and isolates the inner space 11 from the outside.

A susceptor 20 has a horizontally arranged flat plate shape, and is installed in the inner space 11 and supported by a vertically arranged support shaft. After the substrate S is loaded into the inner space 11, it is placed on the top of the susceptor 20 in a substantially horizontal state.

An antenna 16 is a cylindrical antenna disposed around the upper chamber 14, and the antenna 16 is connected to an RF power source (not shown). The RF power source applies power to the antenna 16, and the antenna 16 generates a magnetic field in the inner space 11 through power supplied from the RF power source, and an induced electric field is formed by the magnetic field. The antenna 16 generates plasma from reaction gas supplied to the inner space 11 through a shower head (not shown) installed in the inner space 11. The reaction gas obtains enough energy for ionization from the inductively generated electric field and generates plasma, and the formed plasma moves to the substrate and treats the substrate. For example, the substrate may be nitrided through plasma.

Figure 2:
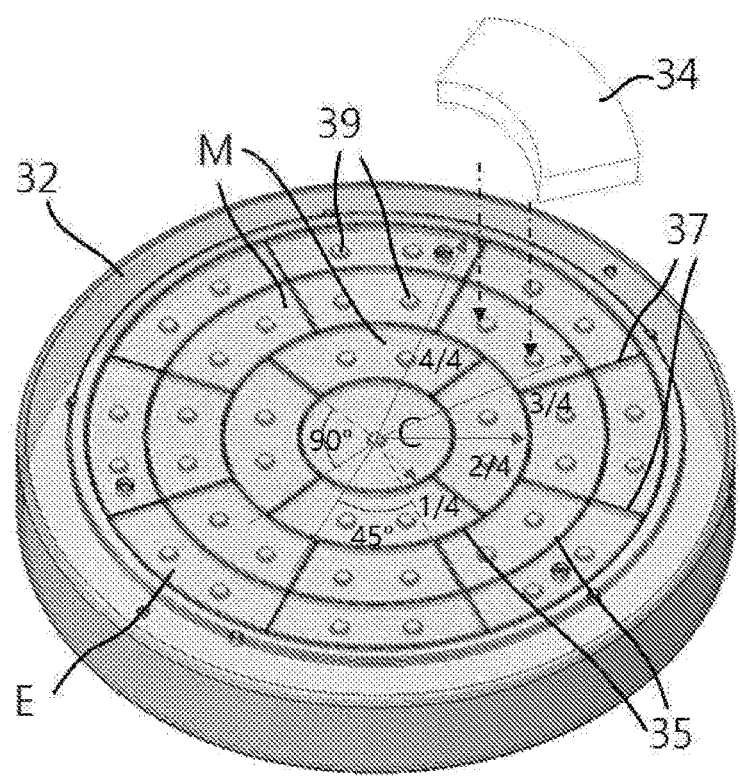
FIGS. 2 and 3 illustrate a cover unit illustrated in FIG. 1.
Figure 3:
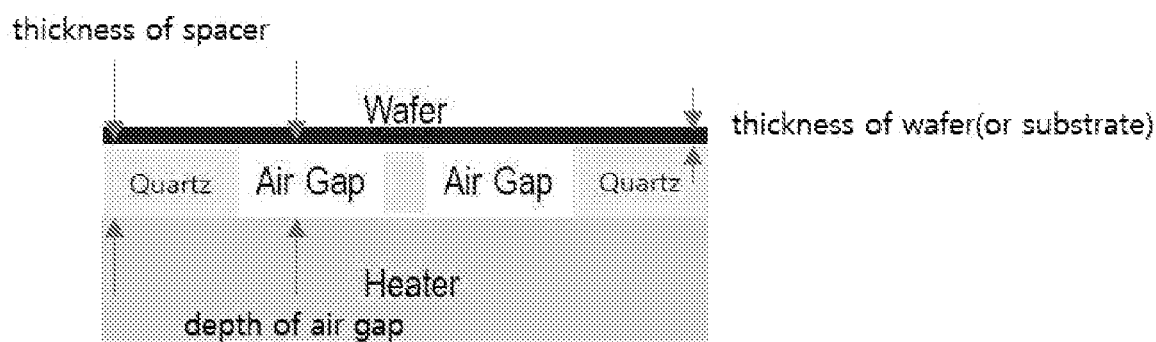

FIGS. 2 and 3 illustrate a cover unit 30 illustrated in FIG. 1. The susceptor 20 may include a heater, and the heater may heat the substrate to a temperature required for processing (or treatment). The cover unit 30 is installed on top of the susceptor 20, and the substrate S is placed on top of the cover unit 30.

Specifically, as shown in FIGS. 2 and 3, the cover unit 30 includes a cover frame and a plurality of covers 34. The cover frame may be installed to cover the upper and side portions of the susceptor 20, and may include a disc-shaped disk 32 and spacers 35 and 37.

The disk 32 is disposed parallel to the upper surface of the susceptor 20 and may be a circular disk corresponding to the upper surface of the susceptor 20. The spacers 35 and 37 include circular spacers 35 and radial spacers 37, and are fixed to the upper surface of the disk 32 to form air gaps between the disk 32 and the substrate S. The circular spacer 35 (the radius of curvature of the circular spacer 35 corresponds to 1/4, 2/4, 3/4, 4/4 of the diameter of the substrate S, but may be an integer multiple of 1/3 or 1/5) may be concentrically arranged with respect to the center of the disk 32. A center gap (C), an edge gap (E), and a middle gap (M) described later can be partitioned by the circular spacer 35. The radial spacers 37 may be radially arranged based on the center of the disk 32 to form an equal angle (45 degrees to 90 degrees shown in FIG. 2, but may be 20 degrees to 45 degrees), and the radial spacers 37 are connected to the circular spacers 35 to partition the center gap (C), the edge gap (E), and the middle gap (M) into equal angles.

In addition, as shown in FIG. 3, the thickness of the spacers 35 and 37 substantially coincides with the depth of the air gaps described later, and the thickness of the spacers 35 and 37 is 2 to 10 times the thickness of the substrate S. However, preferably, the function of the air gap can be secured fully when it is three times or more than the thickness of the substrate (S).

Fixing protrusions 39 protrude from the surface of the disk 32 and can be inserted into a fixing groove formed on the rear surface of the cover 34 described later, so that the cover 34 can be stably fixed. However, unlike the present embodiment, the fixing protrusion 39 may be omitted, and the cover 34 has the same height as the spacers 35 and 37 and is mounted in each air gap through the spacers 35 and 37, so that the movement of the cover 34 can be restricted by spacers 35 and 37. In addition, on the contrary, the spacers 35 and 37 may be omitted, and the cover 34 fixed by the fixing protrusions 39 plays the same role as the spacers 35 and 37, that is, to form an air gap between the disk 32 and the substrate (S). At this time, an air gap may be formed at a position where the cover 34 is removed, and when the cover 34 is installed, the space between the disk 32 and the substrate S is removed by the cover 34, so an air gap can be removed.

On the other hand, the cover frame and cover 34 may be a quartz material.

Figure 4:
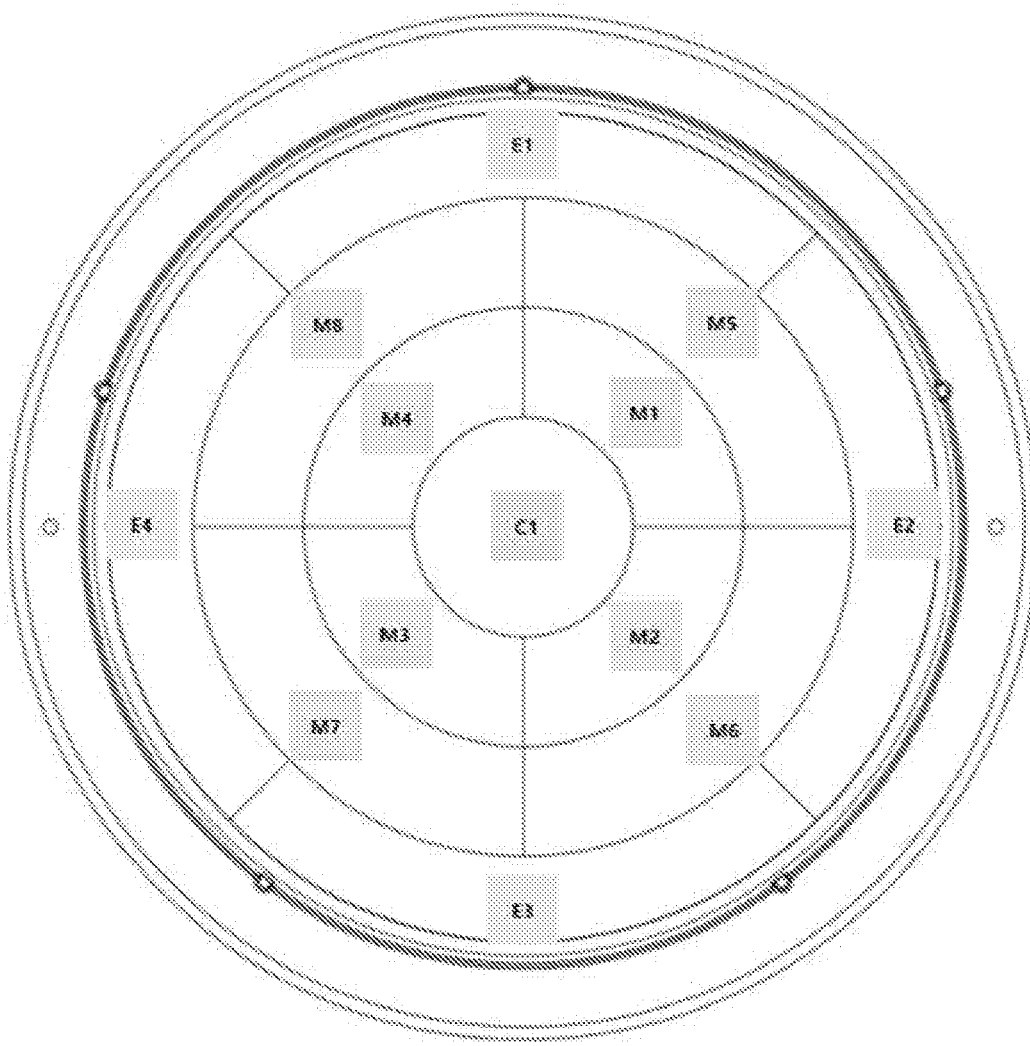
FIG. 4 illustrates another embodiment of the cover frame illustrated in FIG. 2.

Specifically, the air gaps have a center gap (C), edge gaps (E), and middle gaps (M) disposed between the center gaps (C) and the edge gaps (E). The center gap (C) is circular disposed at the center of the susceptor 20 (or disk 32), and the edge gaps (E)/middle gaps (M) are disposed around the center gap (C). The edge gaps (E)/middle gaps (M) may be an arc shape obtained by dividing one ring shape at equal angles, or may be one ring shape otherwise. As shown in FIG. 2, the edge gaps E/middle gaps M may be divided into 4 or 5, but may be divided in a different form. FIG. 4 illustrates another embodiment of the cover frame illustrated in FIG. 2. In addition, the air gap can be divided into various forms, and the uniformity of the process can be adjusted by selecting the material and mounting of the cover 34.

The covers 34 have a shape corresponding to the center gap (C)/edge gap (E)/middle gap (M), respectively, and are detachable. The covers 34 optionally mounted to center gap (C)/edge gap (E)/middle gap (M) so that the center gap (C)/edge gap (E)/middle gap (M) can be substantially removed. Also, the covers 34 optionally removed from the center gap (C)/edge gap (E)/middle gap (M) so that the center gap (C)/edge gap (E)/middle gap (M) can be provided. The covers may be selected from quartz, alumina (Al2O3), silicon (Si), SiO2, Si3N4, Y2O3, etc., and a plurality of covers of different materials may be provided for the same cover.

Figures 5, 6:
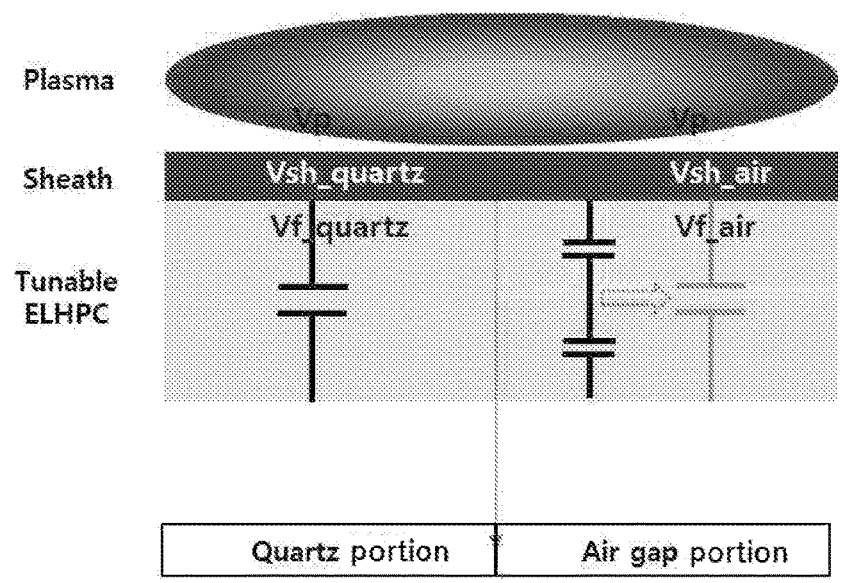
FIG. 5 is a table comparing characteristics of an air gap and a cover.
FIG. 6 shows electrical characteristics of the cover unit shown in FIG. 3.

FIG. 5 is a table comparing characteristics of an air gap and a cover, and FIG. 6 shows electrical characteristics of the cover unit shown in FIG. 3. As shown in FIG. 3, the present invention selectively arranges an air gap or a cover between the substrate S and the susceptor 20, so that the sheath potential acting on the substrate S can be changed locally, and the process rate for each region of the substrate can be independently controlled. As shown in FIG. 5, the dielectric constant of air corresponding to the air gap is 1, whereas the dielectric constant of quartz corresponding to the cover is 4.

Referring to FIG. 6, from the point of view of plasma, the cover 34 and the air gap portion are capacitor factors, and the sheath voltage varies as much as the difference in permittivity. In addition, since the comparison of the charge amount of both corresponds to parallel connection, the charge amount is changed, and the charge amount of the air gap portion is reduced by the difference in permittivity compared to quartz. The sheath voltage of the air gap portion increases due to the reduced floating potential, and the incident amount of plasma increases to the air gap portion where the sheath voltage is high, resulting in an increase in process rate. That is, by removing the cover of a region where the process rate is to be increased, the process rate of the region can be increased.

Figure 7:
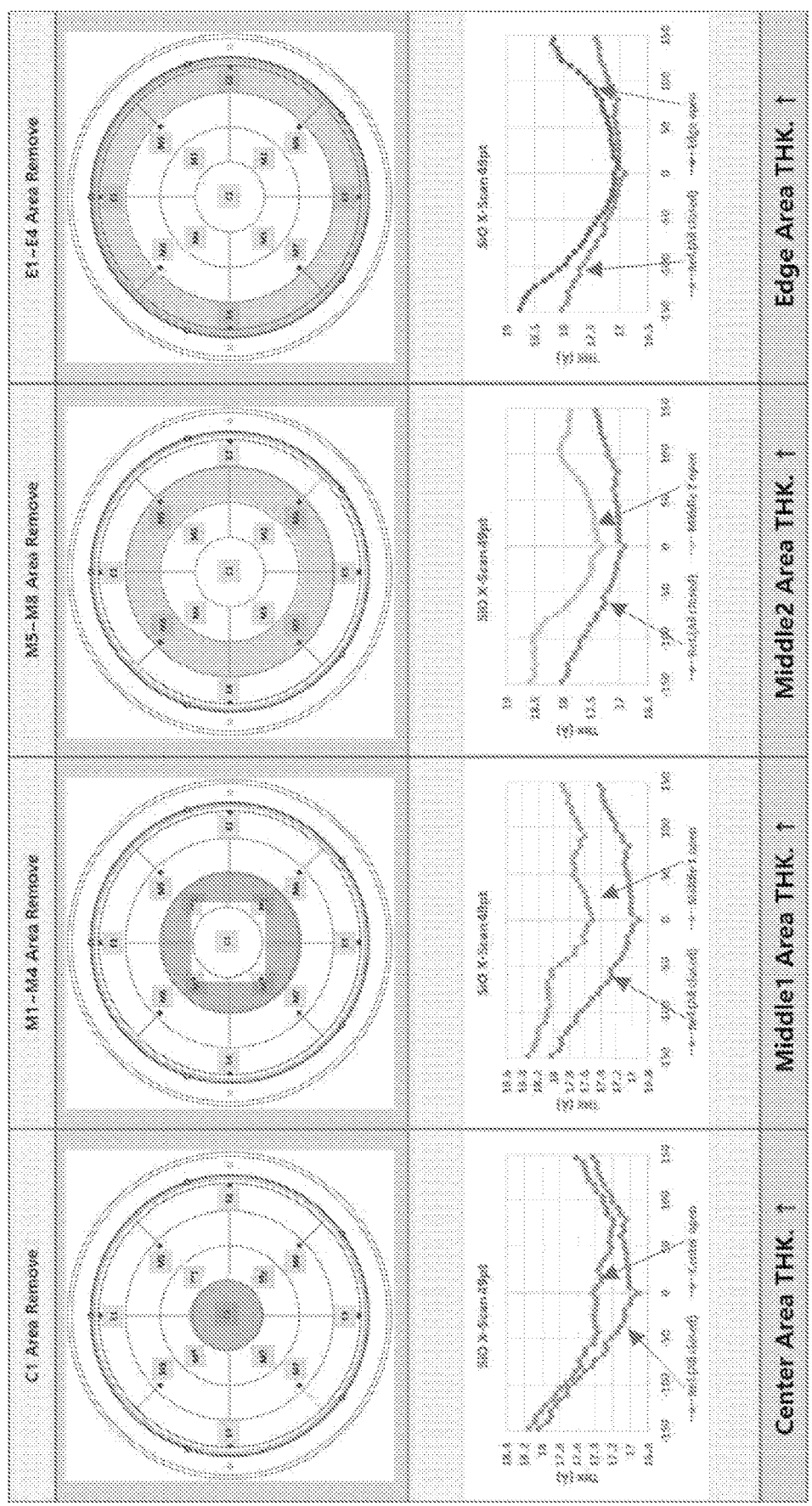
FIGS. 7 and 8 shows process results when the cover unit shown in FIG. 1 is installed/not installed.
Figure 8:
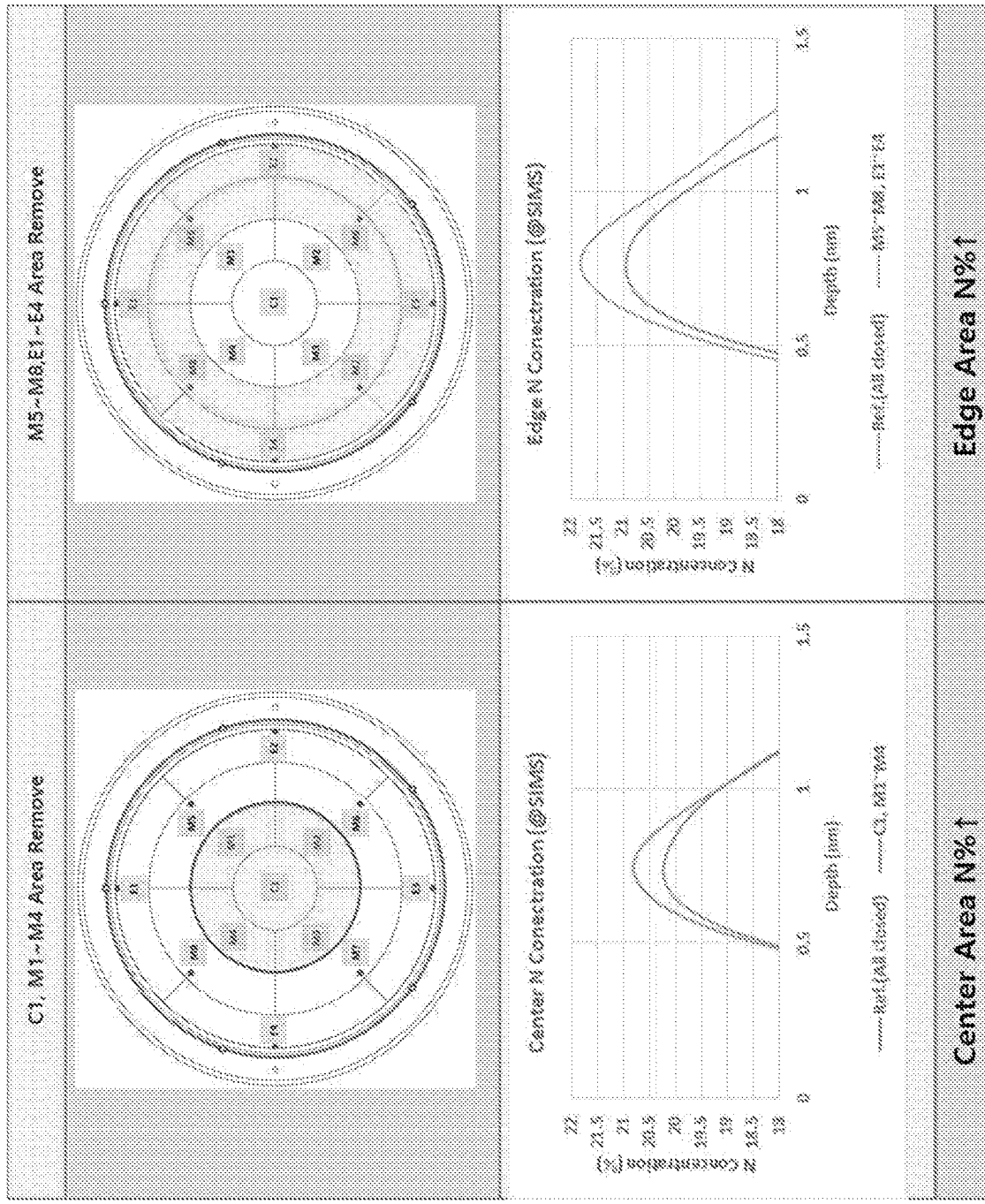

FIGS. 7 and 8 show process results when the cover unit shown in FIG. 1 is installed/not installed. FIG. 7 shows a difference in nitrogen concentration when all covers are installed/when the center cover/middle cover 1/middle cover 2/edge cover are not installed, after plasma nitriding treatment. FIG. 8 shows a difference in thickness of an oxide film when all covers are installed/when some covers are not installed, after plasma oxidation treatment. As shown in FIGS. 7 and 8, it can be seen that the process rate increases at the position where the cover is removed, that is, the position where the air gap is formed, and it can be seen that the process rate increases as the dielectric constant decreases.

On the other hand, in this embodiment, the case where the cover is installed and the case where it is not installed are described separately, but, the difference in process rate can be brought about by changing the material (or dielectric constant) of the cover, and the process rate about each area of the substrate can be independently controlled.

For example, after a process is performed using a dummy substrate (S), the process rate for the dummy substrate (S) is measured, and an air gap is provided according to the process rate of the dummy substrate (S), or the cover is replaced to have a low dielectric constant, so that the process uniformity can be controlled. That is, when the process rate is low in a specific region of the surface of the substrate (S), an air gap can be formed below the corresponding region or the existing cover can be replaced with a cover made of a material with a low dielectric constant. When the process rate is high in a specific region, the air gap can be removed by installing a cover below the corresponding region, or the existing cover can be replaced with a cover made of a material with a high dielectric constant, so that the process uniformity can be adjusted.

According to the embodiment of the present invention, the process uniformity according to the zone of the substrate can be easily adjusted.

Although the present invention is described in detail with reference to the exemplary embodiments, the invention may be embodied in many different forms. Thus, technical idea and scope of claims set forth below are not limited to the preferred embodiments.

What is claimed is:

1. An apparatus for processing substrate comprising:
   a susceptor; and
   a cover unit installed on an upper part of the susceptor to cover the upper part of the susceptor, the substrate being placed on top of the cover unit,
   wherein the cover unit comprises:
   a cover frame having one or more air gaps positioned below the substrate; and
   one or more covers having a shape corresponding to each of the air gaps and mountable in each of the air gaps,
   wherein a depth of the air gap is at least three times the thickness of the substrate.

2. The apparatus for processing substrate of claim 1, wherein the air gaps comprise:
   a center gap located centrally;
   a plurality of middle gaps disposed along the circumference of the center gap, the middle gaps having a center angle of 20 degrees or more; and
   a plurality of edge gaps disposed along the circumference of the middle gaps, the edge gaps having a center angle of 20 degrees or more.

3. The apparatus for processing substrate of claim 1, wherein the cover frame comprises:
   a disk disposed in parallel with an upper surface of the susceptor; and
   a plurality of spacers installed on an upper surface of the disk to form the air gaps between the substrate and the disk, the spacers having a thickness three or more times the thickness of the substrate,
   wherein the spacer comprises:
   a plurality of circular spacers concentrically disposed with respect to the center of the disk; and
   a plurality of radial spacers arranged radially with respect to the center of the disk to connect the circular spacers, respectively.

4. The apparatus for processing substrate of claim 2, wherein the covers comprise:
   a center cover mountable in the center gap;
   a plurality of middle covers each mountable in the middle gap; and
   a plurality of edge covers each mountable in the edge gap.

5. The apparatus for processing substrate of claim 1, wherein the cover frame and the cover are different materials.

6. The apparatus for processing substrate of claim 1, wherein the cover frame comprises:
   a disk disposed in parallel with an upper surface of the susceptor; and
   one or more fixing protrusions protruding from a surface of the disk, the fixing protrusions being inserted into a fixing groove formed on a rear surface of the cover.

7. The apparatus for processing substrate of claim 1, wherein the cover is formed of a material selected from the group consisting of quartz, alumina ($Al_2O_3$), silicon (Si), $SiO_2$, $SiSN_4$, and $Y_2O_3$.

* * * * *